United States Patent
Kamachi et al.

(10) Patent No.: US 8,923,833 B2
(45) Date of Patent: Dec. 30, 2014

(54) INFORMATION SHARING SYSTEM, INFORMATION SHARING METHOD, TERMINAL DEVICE AND PROGRAM

(75) Inventors: Daisuke Kamachi, Tokyo (JP); Takashi Moriyama, Tokyo (JP)

(73) Assignee: Lenovo Innovations Limited (Hong Kong), Quarry Bay (HK)

( * ) Notice: Subject to any disclaimer, the term of this patent is extended or adjusted under 35 U.S.C. 154(b) by 0 days.

(21) Appl. No.: 13/347,348

(22) Filed: Jan. 10, 2012

(65) Prior Publication Data

US 2012/0105309 A1    May 3, 2012

Related U.S. Application Data

(62) Division of application No. 12/281,509, filed as application No. PCT/JP2007/054156 on Mar. 5, 2007.

(30) Foreign Application Priority Data

Mar. 8, 2006    (JP) ................. 2006-062642

(51) Int. Cl.
| | |
|---|---|
| *H04M 3/42* | (2006.01) |
| *H04L 12/18* | (2006.01) |
| *H04L 29/06* | (2006.01) |
| *H04M 1/725* | (2006.01) |
| *H04M 3/56* | (2006.01) |

(52) U.S. Cl.
CPC ........ *H04M 1/7253* (2013.01); *H04M 2250/62* (2013.01); *H04M 1/72552* (2013.01); *H04L 12/1822* (2013.01); *H04M 3/56* (2013.01); *H04M 2250/16* (2013.01); *H04L 65/4061* (2013.01); *H04M 1/72561* (2013.01); *H04M 1/72583* (2013.01); *H04L 12/189* (2013.01)
USPC ........ 455/416; 455/420; 455/414.1; 455/466; 370/338; 715/716; 715/753

(58) Field of Classification Search
CPC ................ H04M 3/56; H04M 3/2281; H04M 2203/5018; H04M 3/562; H04L 12/1818; H04L 12/1813; H04L 12/66
USPC .............. 455/466, 414.1, 328, 338, 418–420; 715/755, 759, 201, 716, 753, 758; 370/328–338
See application file for complete search history.

(56) References Cited

U.S. PATENT DOCUMENTS

| | | | | |
|---|---|---|---|---|
| 5,758,079 | A | * | 5/1998 | Ludwig et al. ................ 709/204 |
| 7,054,660 | B2 | * | 5/2006 | Lord ............................ 455/558 |

(Continued)

FOREIGN PATENT DOCUMENTS

| | | |
|---|---|---|
| JP | 08205112 A | 8/1996 |
| JP | 10283293 A | 10/1998 |

(Continued)

OTHER PUBLICATIONS

Japanese Office Action for JP2008-503839 mailed on Apr. 9, 2013 with English Translation.

(Continued)

*Primary Examiner* — Quan M Hua
(74) *Attorney, Agent, or Firm* — Sughrue Mion, PLLC

(57) ABSTRACT

[PROBLEMS] To share information in one of divided screens of a terminal device with members performing PoC communications.
[MEANS FOR SOLVING PROBLEMS] A plurality of terminal devices used by the members performing PoC communications are included, and at least one of the screens partitioned and displayed by a screen dual-partitioning device 22 on a specific terminal device is shared with other terminal devices used by members performing PoC communications.

11 Claims, 10 Drawing Sheets

(56) References Cited

U.S. PATENT DOCUMENTS

| | | | |
|---|---|---|---|
| 7,188,140 B1* | 3/2007 | Greenspan et al. | 709/204 |
| 2004/0205091 A1* | 10/2004 | Mulcahy et al. | 707/204 |
| 2006/0121947 A1* | 6/2006 | Lee | 455/566 |
| 2006/0148512 A1* | 7/2006 | Ekholm et al. | 455/550.1 |
| 2006/0229094 A1* | 10/2006 | Huh et al. | 455/518 |
| 2007/0097886 A1* | 5/2007 | Schwagmann et al. | 370/260 |
| 2008/0228894 A1* | 9/2008 | Chen et al. | 709/207 |

FOREIGN PATENT DOCUMENTS

| | | |
|---|---|---|
| JP | 2003030121 A | 1/2003 |
| JP | 2004-228805 A | 8/2004 |
| JP | 2005-184366 A | 7/2005 |
| JP | 2005197945 A | 7/2005 |
| JP | 2006042356 A | 2/2006 |
| WO | 03/077098 A1 | 9/2003 |
| WO | 03/077553 A1 | 9/2003 |

OTHER PUBLICATIONS

Communication dated Sep. 9, 2014, issued by the Japan Patent Office in corresponding Japanese Application No. 2013-20565.

Communication dated Sep. 2, 2014, issued by the Japanese Patent Office in corresponding Japanese Application No. 2013-219902.

NTT DoCoMo FOMA SH902i, Instruction Manual, NTT DoCoMo Group, Sharp Corporation, Dec. 2005, 1st Edition, p. 97-101.

* cited by examiner

INFORMATION SHARING SYSTEM, INFORMATION SHARING METHOD, TERMINAL DEVICE AND PROGRAM

REFERENCE TO RELATED APPLICATION

This is a divisional application of U.S. patent application Ser. No. 12/281,509 filed Sep. 3, 2008 and claims the benefit of its priority.

TECHNICAL FIELD

The present invention relates to a technique to share information with members performing PoC (Push to talk over Cellular) communications using mobile terminals.

BACKGROUND ART

Conventionally, in mobile terminals such as mobile phones, it is basically required to always check presence statuses of the members and to listen to the dialogues of the members during PoC communications.

In order to perform general operations of a mobile phone such as e-mail editing and site viewing while checking presence statuses of the members, it has been required to use a multitask function or the like to perform operation by switching one screen. For example, when a meeting was being held through PoC communications, it was impossible to edit an e-mail while constantly checking presence statuses of the member participating in the meeting.

A technique has been proposed to move a cursor to any desired position on a display screen with fewer and easy operations without any special hardware, by partitioning an LCD by a screen partitioning unit into a plurality of screens, and selecting one desired screen by a screen selection unit from the partitioned screens and narrowing the range to the target position in the LCD before performing movement in one dot unit (for example, see Patent Document 1).

Patent Document 1: Japanese Patent Laid-Open Publication No. 2002-014773

DISCLOSURE OF THE INVENTION

Problems to be Solved by the Invention

However, there has been a problem even though the above-described conventional example was applied to the screen of a terminal device.

As it has been impossible to share one of the partitioned screens of a terminal device with the members performing PoC communications, performing various communications among the members smoothly has been difficult.

The present invention has bee developed in view of the above-described problem. It is therefore an object of the present invention to share information in one of the partitioned screens of a terminal device with members performing PoC communications.

Means for Solving the Problems

In order to solve the problem, the present invention provides a terminal device which allows at least one of partitioned screens displayed on the device to be shared with other terminal devices used by the members performing PoC communications.

Further, the present invention provides a terminal device which shares at least one of the partitioned screens displayed on a predetermined terminal used by a member performing PoC communications.

Further, the present invention provides terminal devices which display and share partitioned screens displayed on a plurality of predetermined terminals used by the members performing PoC communications.

Further, the present invention provides an information sharing system including a plurality of terminal devices used by the members performing PoC communications, in which at least one of partitioned screens displayed on a predetermined terminal device is shared with another terminal device used by a member performing the PoC communications.

Further, the present invention provides an information sharing system including a plurality of terminal devices used by the members performing PoC communications, in which partitioned screens displayed on a plurality of predetermined terminal devices are shared, by being displayed simultaneously, with other terminal devices used by the members performing the PoC communications.

Further, the present invention provides an information sharing method using a plurality of mobile terminals used by the members performing PoC communications, including the steps of partitioning a screen and displaying partitioned screens on a predetermined terminal device, and sharing at least one of the partitioned and displayed screens with another terminal device used by a member performing the PoC communications.

Further, the present invention provides an information sharing method using a plurality of terminal devices used by the members performing PoC communications, including the steps of partitioning each of screens and displaying partitioned screens on a plurality of predetermined terminal devices, and sharing, by displaying simultaneously, the partitioned screens with another terminal device used by a member of the PoC communication.

Effect of the Invention

According to the present invention, information on one of partitioned screens of a terminal device can be shared with the members performing PoC communications.

BEST MODE FOR CARRYING OUT THE INVENTION

Hereinafter, a first exemplary embodiment of the invention will be described in detail with reference to the drawings.

Referring to FIGS. 2 and 3, a terminal device in an information sharing system according to the exemplary embodiment includes: a mobile terminal 31, a key input object screen switching button 32, a PoC communicating screen 33 partitioned by a screen dual-partitioning device 22, an i-mode (registered trademark) screen 34, a rule setting device 21, and a key input object screen switching device 23.

In this configuration, the screen dual-partitioning device 22 and the rule setting device 21 configure a screen activating unit which partitions the screen of the mobile terminal 31 into a plurality of screens and activates them, corresponding to PoC communications. The key input object screen switching device 23 configures a switching selector unit which switches between the plurality of activated screens and selects one. In this case, the rule setting device 21 sets rules for PoC communications beforehand, and as shown in FIG. 3, the screen dual-partitioning device 22 activates, according to the rules set by the rule setting device 21, the i-mode (registered trademark) screen when keys of the keyboard not to be used during PoC communications are manipulated, and an e-mail screen when one button (key) is pushed for a while, together with the PoC communicating screen. Note that rules to be set by the rule setting device 21 are not limited to those described above.

Next, operation of the exemplary embodiment will be described (active system: activate i-mode (registered trademark) during PoC communications).

First, it assumes that a user A who often uses PoC (Push to talk over Cellular) communications in business and private sets a rule by means of the rule setting device 21 such that i-mode (registered trademark) is activated by pushing the button of a numerical key "1" of the keyboard or the like during PoC communications. Here, PoC is a system in which a push to talk system capable of switching between a plurality of calls by operating buttons is realized on mobile terminals such as mobile phones. For keys of the keyboard or the like to be used for button operations to switch between the calls, those not to be used during PoC communications are used. Although the calls to be switched during PoC communications is limited to two in the exemplary embodiment, the number of calls is not limited to this example.

Now, the user A using the mobile terminal 31 is participating in a meeting over PoC communications. Although the user A is currently performing PoC communications, the user remembers that he/she has to make a bank transfer immediately via a web site of i-mode (registered trademark).

However, the user has to check the presence states of the members performing PoC communications in the meeting using the PoC communications. Further, in the meeting, the user has to make instructions to the members as required.

As such, the user A uses the screen dual-partitioning device 22 to partition the screen of the mobile phone into the PoC communicating screen 33 and the i-mode (registered trademark) screen 34, and activates the partitioned screen 33 and 34 in parallel.

When the screen of the mobile terminal 31 is partitioned into two and activated by the screen dual-partitioning device 22, the PoC communicating screen 33 which is a screen of the meeting and the i-mode (registered trademark) screen 34 are activated and displayed on the screen of the mobile terminal 31, as shown in FIG. 1 for example. On the PoC communicating screen 33, the presence statuses of the members performing PoC communications, which has been displayed, is currently displayed as shown in FIG. 1 for example, and the user can also perform communications through i-mode (registered trademark) using the i-mode (registered trademark) screen 34.

As a button for operating the key input object screen switching device 23, the button 32 of the mobile terminal 31 is set. The key input object screen switching device 23 is activated by operating this button 32, and a screen to which information is input by using keys of the keyboard is set to either one of the partitioned screens 33 and 34. More specifically, when the user A sets to switch to "up", that is, the PoC communicating screen 33, by the key input object screen switching button 32 for operating the key input object screen switching device 23, input of information using the key input device (keyboard, etc.) of the mobile terminal 31 will be performed to the PoC communicating screen 33.

If the user A sets to switch to "down", that is, i-mode (registered trademark) screen 34, by the key input object screen switching button 32, input of information using the key input device (keyboard, etc.) of the mobile terminal 31 will be performed to the i-mode (registered trademark) screen 34. In this case, it is possible to input necessary information on a web site for bank transfer of i-mode (registered trademark), for example.

By separating objects of key input for the PoC communicating screen 33 and for the i-mode (registered trademark) screen 34 by means of the key input object screen switching button 32, the user A can process processing not related to the meeting in parallel while participating in the meeting.

Thereby, the present invention is capable of satisfying the user's needs to perform i-mode (registered trademark) or e-mail editing while checking the presence statuses of the group members performing PoC communications. Further, in the case that the user himself/herself does not need to speak but has to wait for another member's comments during PoC communications, it is possible to avoid the screen of the mobile phone being occupied only for checking the presence statuses of the members. Instead, a plurality of calls can be processed in parallel. Further, for an effective key operation being required because of the number of keys being limited on a mobile phone, it is possible to effectively input information into a screen being switched in PoC communications by using keys not required for the PoC communications.

Further, as shown in FIG. 4, a plurality of users A, B, and C perform PoC communications one another, and the screen of the mobile terminal 31 is divided into the PoC communication screen 33 and the i-mode (registered trademark) screen 34. Then, the user C is capable of easily notifying the users A and B performing the PoC communications of information on a site that the user C desires to share with all other members (users A and B) by sharing the site screen of page C of i-mode (registered trademark) displayed on the i-mode (registered trademark) screen 34 of the mobile terminal C of the user C.

Further, as shown in FIG. 5, the screen dual-partitioning device 22 may be configured to activate a plurality of screens displayed on the mobile terminals 31 held by members performing PoC communications on one screen. More specifically, by simultaneously displaying, on the partitioned i-mode (registered trademark) screen 34 of the terminal A of the user A, the site screen of a page C of i-mode (registered trademark) displayed on the i-mode (registered trademark) screen 34 of the mobile terminal C of the user C and the site screen of a page B of i-mode (registered trademark) displayed on the i-mode (registered trademark) screen 34 of the terminal B of the user B, the user A can easily acquire information of a plurality of members. Further, by giving operational authorization, the i-mode (registered trademark) screen 34 on the terminal C of the user C or on the terminal B of the user B may be operated from the terminal A of the user A.

Further, as shown in FIG. 6, the screen dual-partitioning device 22 may be configured to reflect the screen function settings, displayed on the mobile terminal 31 held by a communication counterpart, on the screen function settings of the mobile terminal of his/her own. More specifically, by displaying the setting screen of a machine answering function displayed on the i-mode (registered trademark) screen 34 of the terminal A, owned by the mother, on the i-mode (registered trademark) screen 34 on the terminal B owned by her son, the setting screen of the machine answering function may be shared with the members performing PoC communications so as to set the machine answering function of the i-mode (registered trademark) screen 34 on the mother's terminal A from the son's terminal B. If this function is realized as a service which can be used only between terminals made by the same manufacturer, this may promote selecting terminals made by the same manufacturer by all family members.

Next, a second exemplary embodiment of the invention will be described.

Referring to FIGS. 7 and 8, a terminal device in an information sharing system of the exemplary embodiment includes a mobile terminal 51, a key input object screen switching button 43, a PoC communicating screen 52 which is partitioned by a screen dual-partitioning device 42, a new e-mail screen 53, and a rule setting device 41.

In this configuration, the screen dual-partitioning device 42 and the rule setting device 41 configure a screen activating unit which partitions the screen of the mobile terminal 51 into a plurality of screens corresponding to PoC communications and activates them. The key input object screen switching device 43 configures a switching selector unit which switches between the plurality of activated screens and selects one. In this case, it assumes that the screen dual-partitioning device 42 and the rule setting device 41 are set such that the screen is partitioned into two screens when an e-mail is received and the new e-mail is opened, according to Rule 1. However, rules set by the screen dual-partitioning device 42 and the rule setting device 41 are not limited to Rule 1 mentioned above.

The screen activating units (41, 42) keeps one of the partitioned screens in an activated state, and when PoC communications begin, the remaining partitioned screen is activated by interrupting the one screen.

Next, operation of the exemplary embodiment will be described (passive system: receive e-mail during PoC communications).

First, a user B uses the rule setting device 41 to partition the screen into two screens when receiving an e-mail during PoC communications so as to enable the user to view and edit the new e-mail while displaying the PoC communication screen, and sets Rule 1 from those shown in FIG. 1 for example.

It assumes that the user B using the mobile terminal 51 is now in a meeting using PoC communications, and is receiving an e-mail.

As set by the rule setting device 41, the screen of the mobile terminal 51 is automatically partitioned into a PoC communicating screen 52 and a new e-mail screen 53 by means of a screen dual-partitioning device 42.

The PoC communicating screen 52 displays the presence statuses of the members performing the PoC communications which have been displayed. The new e-mail screen 53 is displayed on a part of the PoC communicating screen by interrupting the PoC communicating screen 52, and the content of a new e-mail is displayed on the new e-mail screen 53.

In this case, it assumes that the content of the e-mail requires an immediate response and also, it is required to carefully monitor the PoC communicating screen 52 so as to keep checking the presence statuses of the members performing the PoC communications. Further, it also assumes that an instruction must be given to the members as required.

The user B switches the key input object screen from the PoC communicating screen 52 to the new e-mail screen 53 by means of the key input object screen switching button 43, and replies to the e-mail using the new e-mail screen 53.

Next, a third exemplary embodiment of the invention will be described.

Referring to FIGS. 9 and 10, a terminal device of an information sharing system according to the exemplary embodiment includes a mobile terminal 71, a PoC communicating screen 72 and an incoming call display screen 73 which are partitioned by a screen dual-partitioning device 62, and a rule setting device 61.

In this configuration, the screen dual-partitioning device 62 and the rule setting device 61 configure a screen activation unit which partitions the screen of the mobile terminal 71 into a plurality of screens and activates them corresponding to PoC communications. In this case, the rule setting device 61 sets rules for PoC communications beforehand. More specifically, the rule setting device sets, as Rule 1, whether or not to notify an incoming call (sets "YES" or "NO"), and as Rule 2, voice settings during PoC communications when a talk button is pushed, for example. The rule setting device 61 sets the voice during PoC communications to mute as Rule 2-1, sets to reduce (halve for example) the volume of the voice during PoC communications as Rule 2-2, and sets to record the voice during PoC communications as Rule 2-3. However, the rules to be set by the rule setting device 21 are not limited to those described above. Note that in the exemplary embodiment, the push button for calling of the mobile terminal 71 configures a switch selector unit for switching between a plurality of activated screens and selecting one.

Next, operation of the exemplary embodiment will be described (passive system: call incoming during PoC communications).

First, a user C sets "YES" to Rule 1, that is, notifying an incoming call when a call is incoming during PoC communications, and sets Rule 2-3 of the voice setting rule 2 during PoC communications when a talk button is pushed so as to be in a state of recording voices during PoC communications, by means of the rule setting device 61.

Now, the user C using the mobile terminal 71 is in a meeting using PoC communications. In this situation, it assumes that a call is incoming.

As set by the rule setting device 61, the screen of the mobile terminal 71 is automatically partitioned into a PoC communicating screen 72 and an incoming call display screen 73 by means of the screen dual-partitioning device 62, and activated.

The PoC communicating screen 72 displays presence statuses, which have been displayed, of the members performing PoC communications, and the incoming call display screen 73 displays that a call is incoming.

In this state, it assumes that when the user looks at the incoming call display screen 73, a call from an important business partner is incoming, whereas the user is in a meeting using PoC communications, and is required to take minutes of the meeting held through the PoC communications.

The user C answers the phone by pushing the talk button. As the user C has set to record the voices during the PoC communications according to Rule 2, the voices during the PoC communications are being recorded. As such, the user C is capable of preparing the minutes by playing back the recorded contents of the meeting during the PoC communications after the call that the user answered by pushing the talk button ends.

According to the respective exemplary embodiments described above, as the screen of a mobile phone is partitioned into two screens according to operational settings of another application performing PoC communications of the user, it is possible to operate general functions of the mobile phone on one screen while checking the presence statuses of the members on the other screen. Further, the user can perform key operations to a desired screen by using the active screen selector switch.

Note that a screen may be partitioned into not only upper and lower parts but also right and left parts. Although the screen is partitioned into two parts in the exemplary embodiment, the screen may be partitioned into three or more parts. Further, a combination of the partitioned screens may be for an e-mail and i-mode (registered trademark), not limited to PoC.

As a trigger to switch the multi-screen, not only a touch to a hinge portion of a mobile terminal, but also a touch to a liquid crystal panel part having a touch sensor, a command input through an external cable having a remote control function, and a voice input to a microphone (including keyword voices and sound input other than voice) in a waiting state of a voice recognizing function may be used.

The exemplary embodiments described above are preferred exemplary embodiments of the invention, which can be modified in various ways within the scope of the subject matter of the present invention. For instance, processing to realize functions of the mobile terminal 31, the mobile terminal 51 and the mobile terminal 71 may be performed by installing a program to realize the functions of the respective terminals so as to execute the functions. Further, the program may be transmitted to another computer system via computer readable recording media such as CD-ROM and optical magnetic discs or by transmission waves via transmitting media such as the Internet and telephone networks.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2006-062642, filed on Mar. 8, 2006, the disclosure of which is incorporated herein in its entirety by reference.

Figure 1:
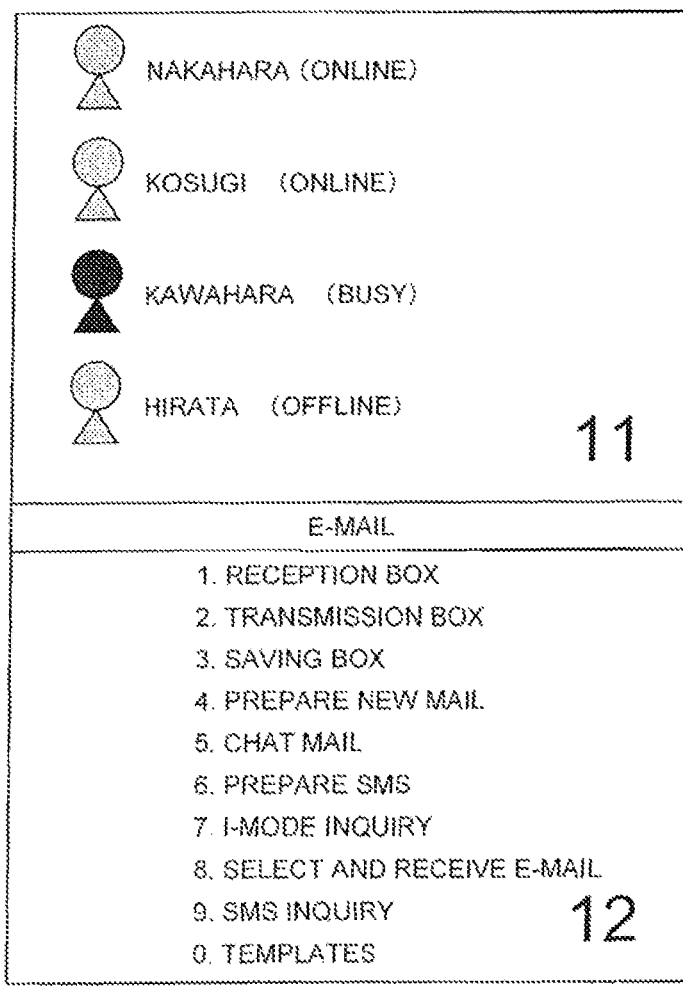
FIG. 1 is an illustration showing presence statuses of the members performing PoC communications according to an exemplary embodiment of the invention.
Figure 2:
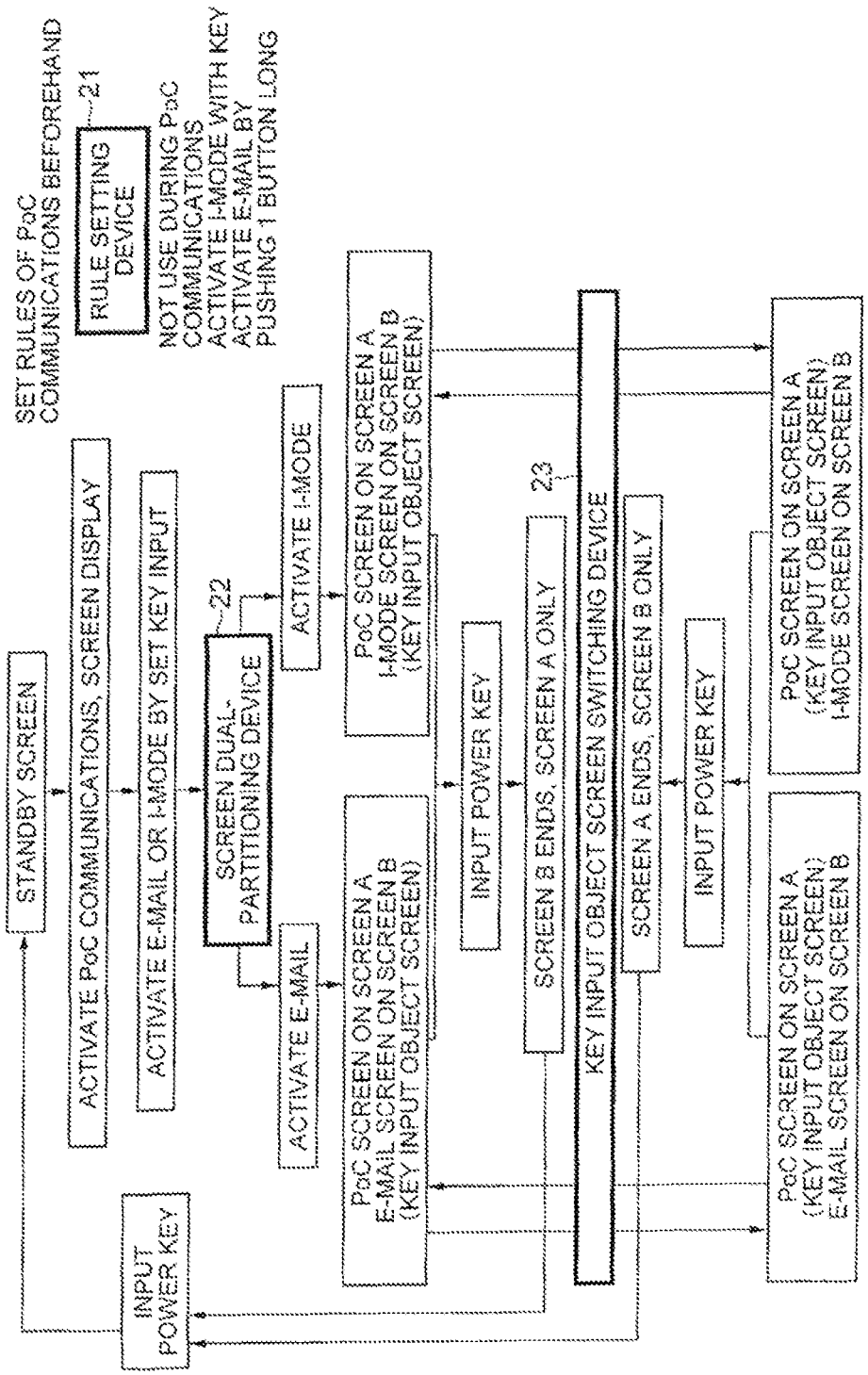
FIG. 2 is a flowchart showing the operation of the first exemplary embodiment of the invention.
Figure 3:
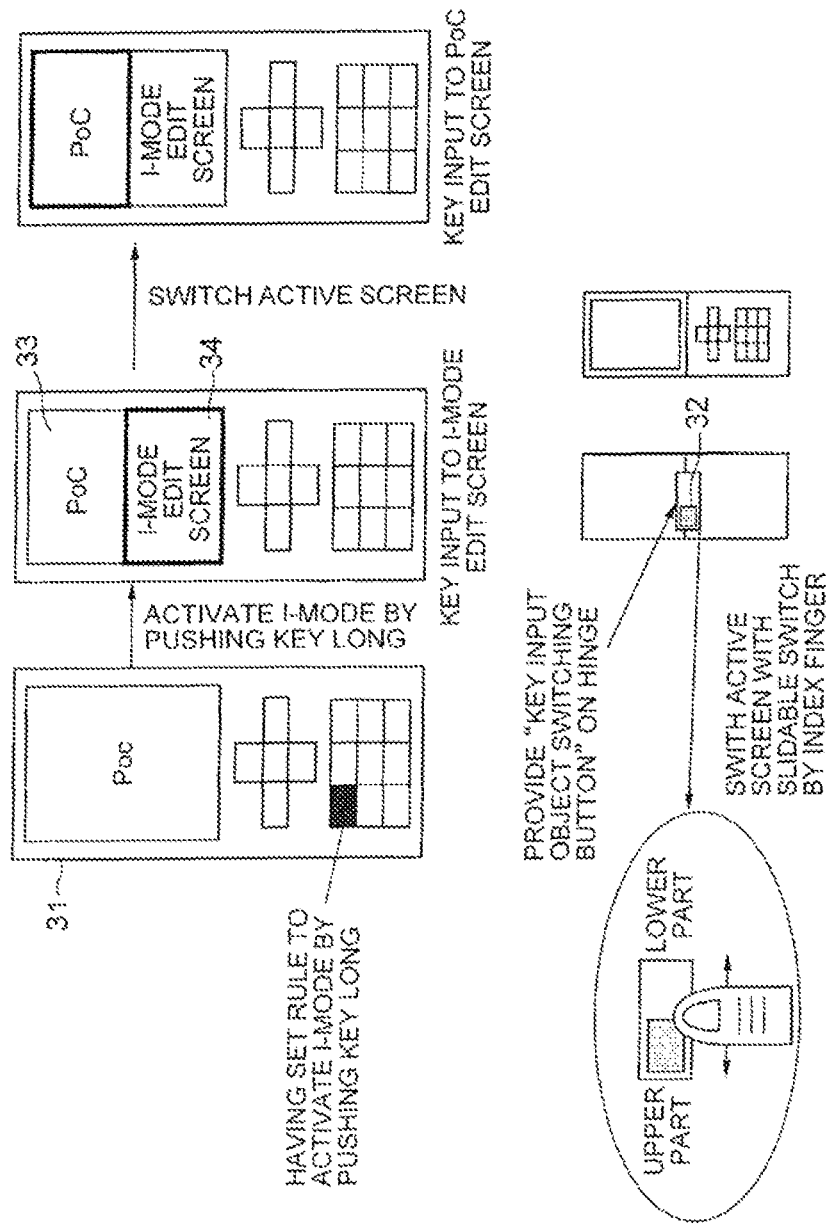
FIG. 3 is an illustration showing the configuration of a mobile terminal according to the first exemplary embodiment of the invention.
Figure 4:
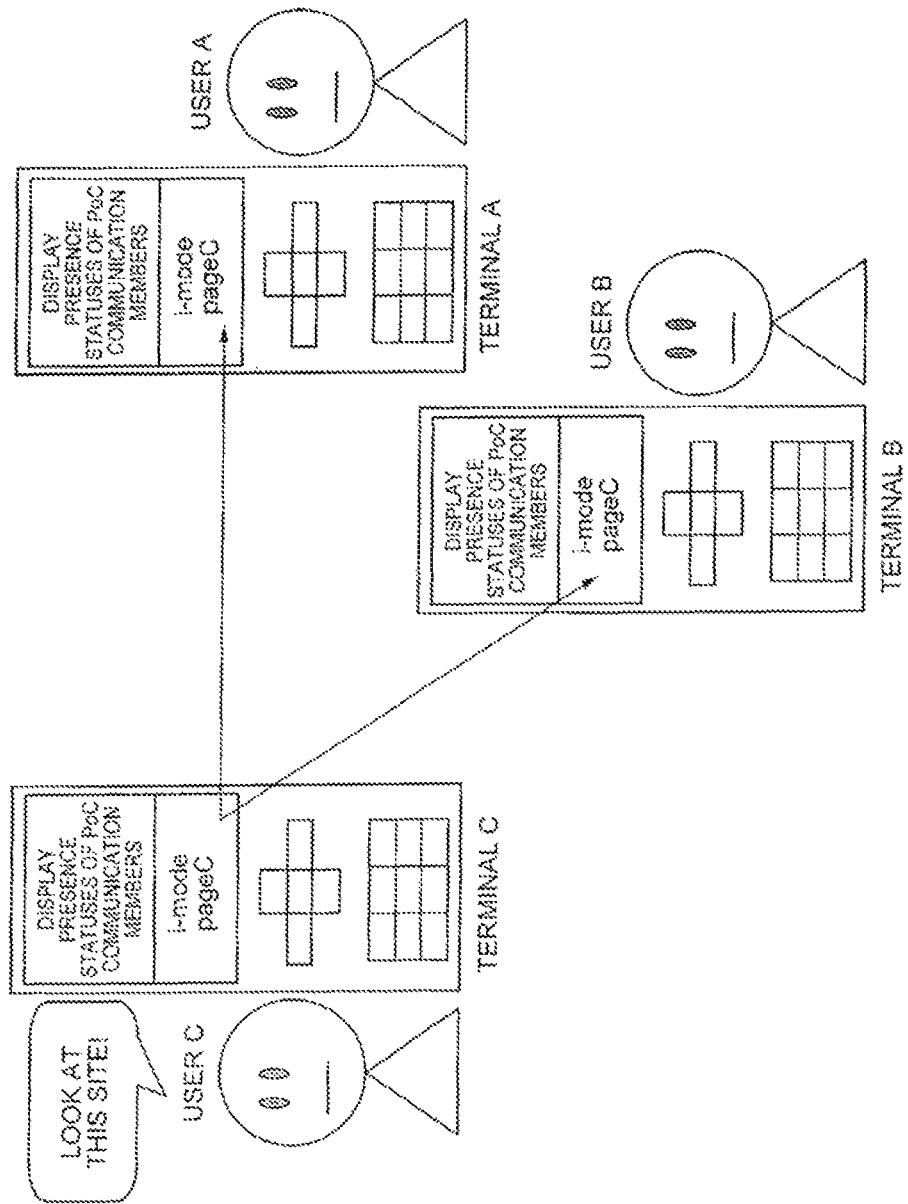
FIG. 4 is an illustration showing an exemplary configuration of sharing a screen according to the first exemplary embodiment of the invention.
Figure 5:
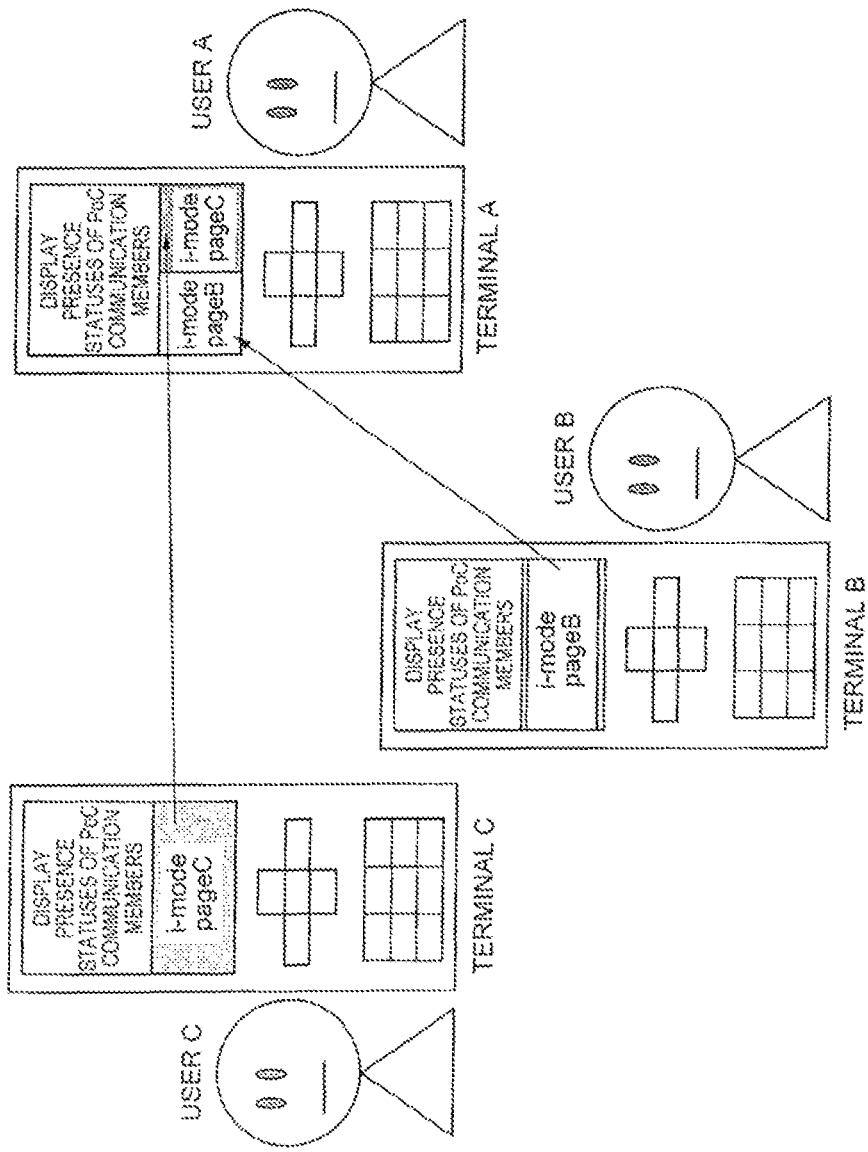
FIG. 5 is an illustration showing an exemplary configuration of sharing a screen according to the first exemplary embodiment of the invention.
Figure 6:
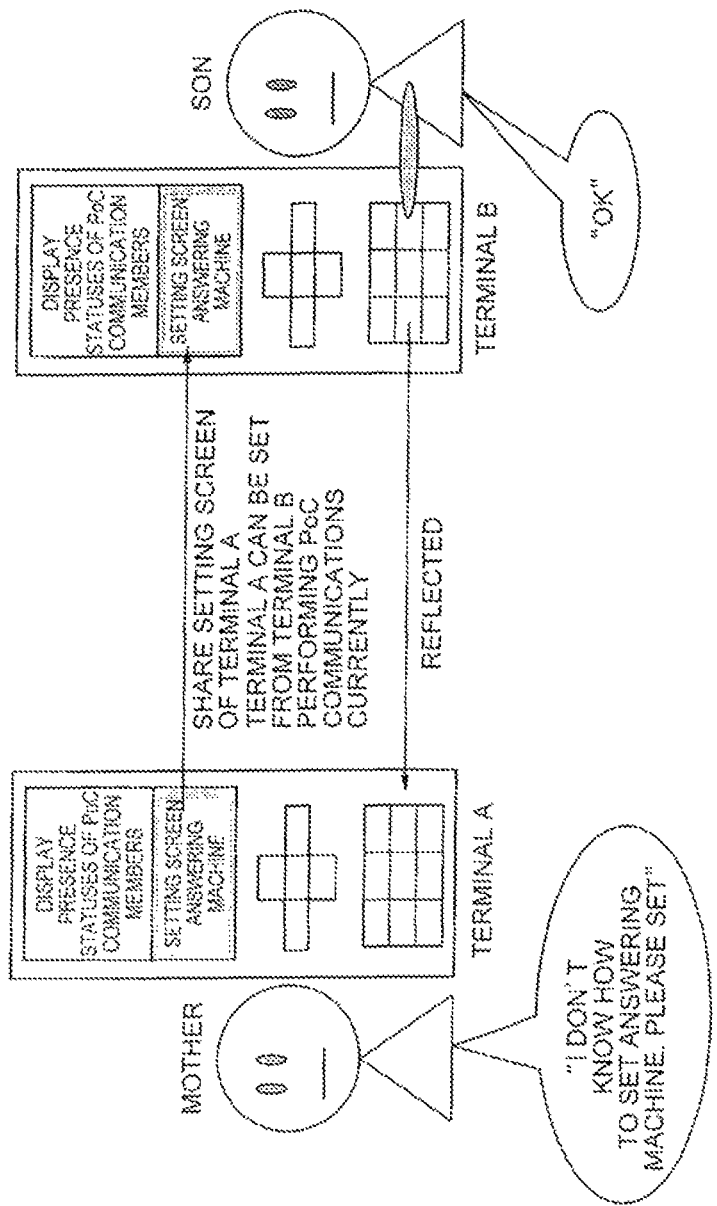
FIG. 6 is an illustration showing an exemplary configuration of sharing a screen according to the first exemplary embodiment of the invention.
Figure 7:
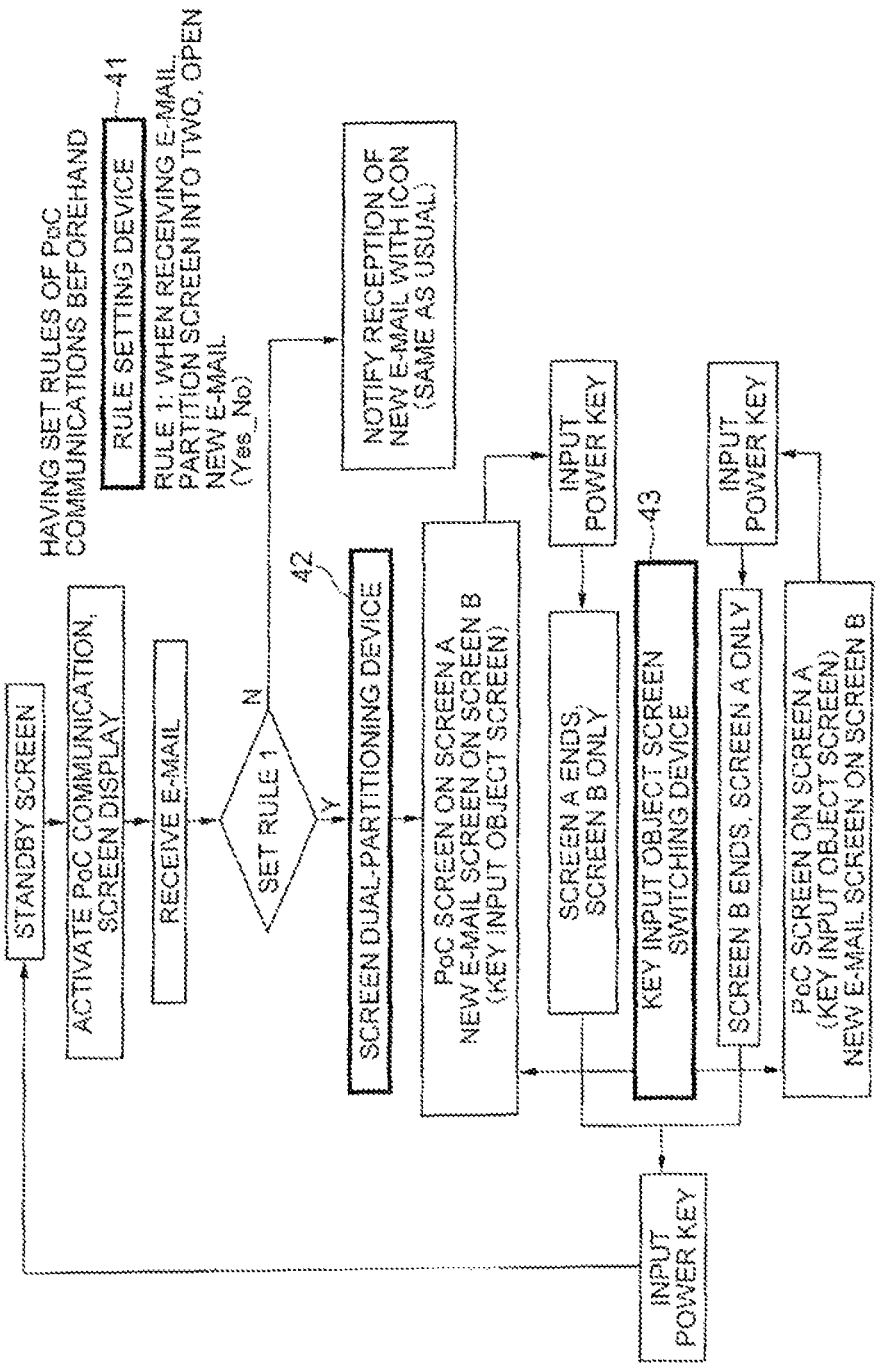
FIG. 7 is a flowchart showing the operation of the second exemplary embodiment of the invention.
Figure 8:
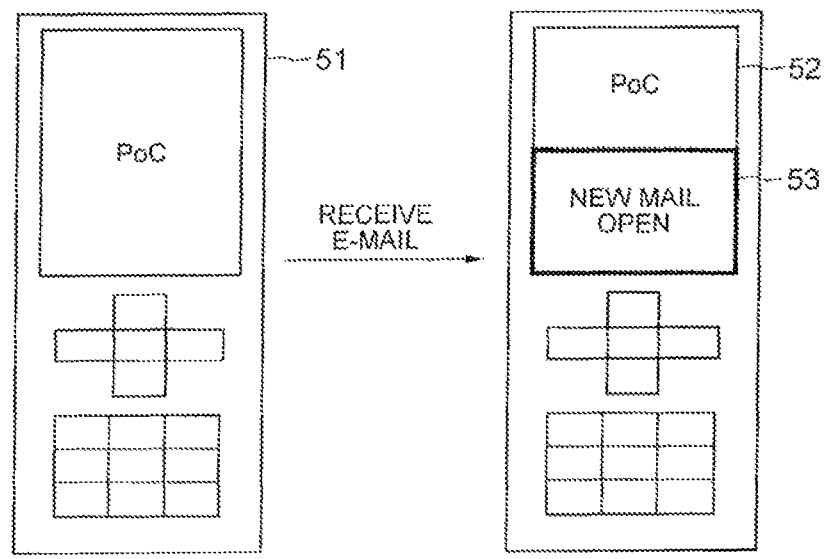
FIG. 8 is an illustration showing the configuration of a mobile terminal according to the second exemplary embodiment of the invention.
Figure 9:
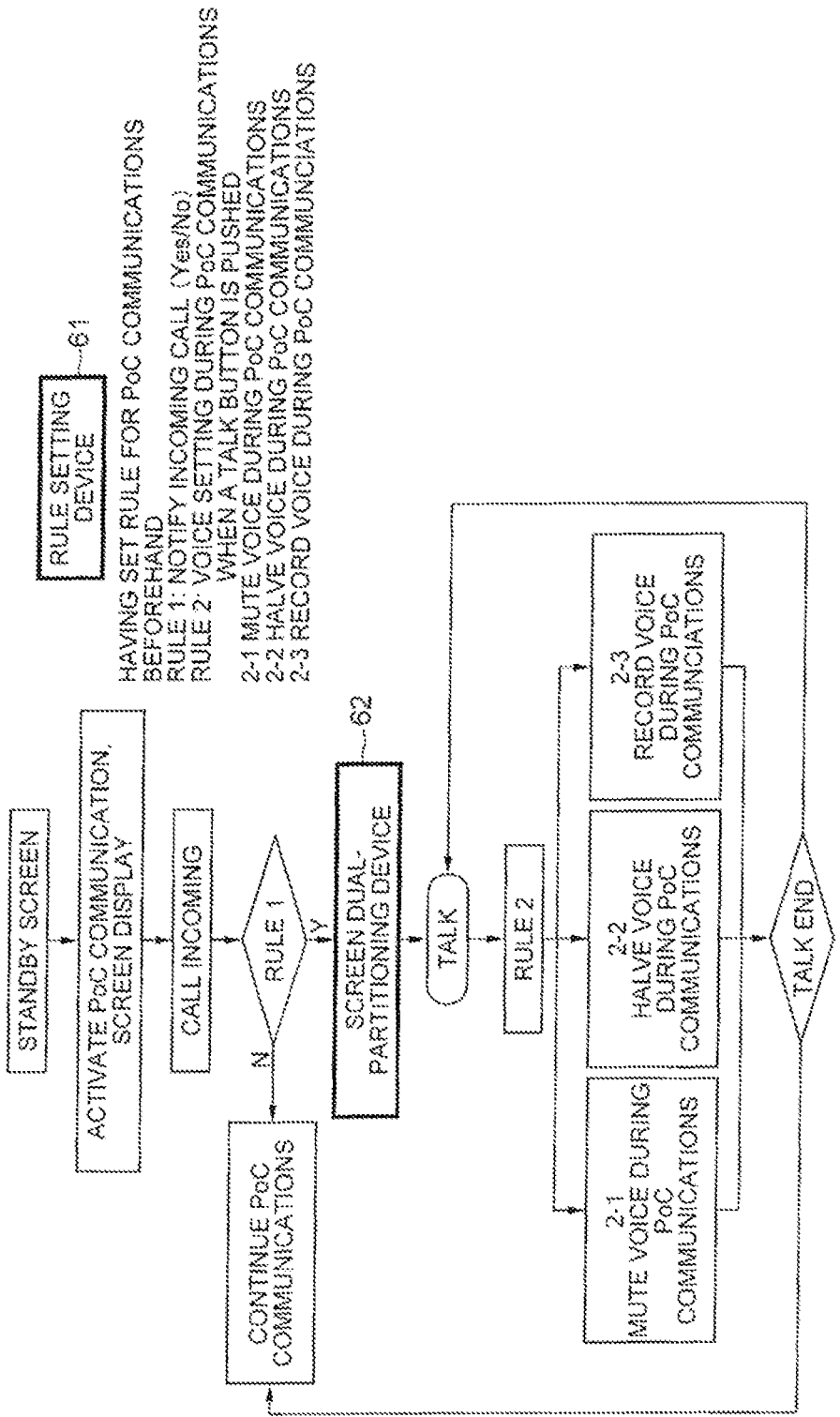
FIG. 9 is a flowchart showing the operation of the third exemplary embodiment of the invention.
Figure 10:
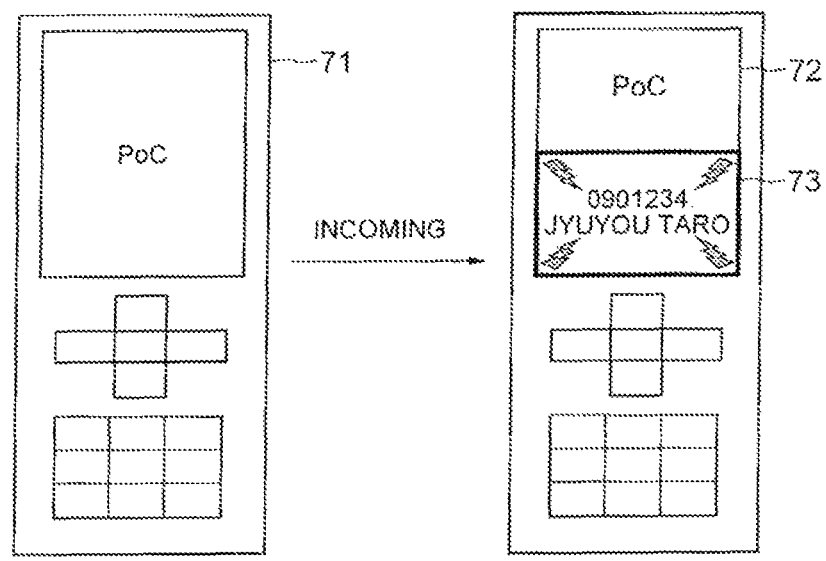
FIG. 10 is an illustration showing the configuration of a mobile terminal according to the third exemplary embodiment of the invention.

DESCRIPTION OF REFERENCE NUMERALS 21 rule setting device
22 screen dual-partitioning device
23 key input object screen switching device
31 mobile terminal
32 key input object screen switching button
33 PoC communicating screen
34 i-mode (registered trademark) screen

The invention claimed is:

1. An information sharing system including a plurality of terminal devices used by members performing Push to talk over Cellular (PoC) communications,
wherein the terminal devices include mobile phones used by members performing PoC, each of the mobile phones having a single screen operable and switchable with a use of multitask function,
wherein each of the mobile phones comprises:
a screen activating unit for partitioning the single screen into a plurality of partitioned views and simultaneously displaying the plurality of partitioned views on the screen of the terminal device, the plurality of partitioned views including a first partitioned view used for PoC communications, wherein
the plurality of partitioned views include a second partitioned view, the second partitioned view used for communications other than the PoC communications,
the plurality of terminal devices includes a first terminal device and a second terminal device,
the screen activating unit of the second terminal device displays the first partitioned view of the first terminal device on the first partitioned view of the second terminal device, whereby the first and the second terminal devices share the first partitioned view,
each of the terminal devices further comprising:
a key input object screen switching device for switching and selecting an activated one of the plurality of partitioned views; and
a key input object screen switching button for operating the key input object screen switching device,
wherein:
the key input object screen switching device is activated with the key input object screen switching button;
a view to which information is input by using keys of a key input device is set to one of the plurality of partitioned views;
when the view to which information is input is set to the first partitioned view, information is input to the first view using the key input device of the terminal device; and
when the view to which information is input is set to the second partitioned view, information is input to the second view using the key input device of the terminal device.

2. The information sharing system as claimed in claim 1, wherein the key input object screen switching button is for switching the second partitioned view included in the plurality of partitioned views while displaying the first partitioned view on the screen of the terminal device.

3. The information sharing system of claim 1, wherein a function setting of the shared partitioned view is performed in the second terminal device, and the setting is reflected on the first terminal device.

4. An information sharing method using a plurality of terminal devices used for Push to talk over Cellular (PoC) communications, the terminal devices including mobile phones used by members performing PoC, each of the mobile phones having a single screen operable and switchable with a use of multitask function, the information sharing method comprising:
partitioning the single screen into a plurality of partitioned views including a first partitioned view for PoC communications and a second partitioned view used for communications other than the PoC communications;

simultaneously displaying the first partitioned view and the second partitioned view on the screen of the terminal device;

displaying the first partitioned view of a first terminal device included in the plurality of terminal devices on the first partitioned view of a second terminal device included in the plurality of terminal devices at a same time, whereby the first and the second terminal devices share the first partitioned view;

selecting an activated one of the plurality of partitioned views using a key input object screen switching button, thereby setting a view to which information is input by using keys of an input device;

wherein:

when the view to which information is input is set to the first partitioned view, inputting information to the first view using the key input device of the terminal device; and when the view to which information is input is set to the second partitioned view, inputting information to the second view using the key input device of the terminal device.

5. The information sharing method of claim 4, further comprising switching a second partitioned view included in the plurality of partitioned views while displaying the first partitioned view.

6. The information sharing method of claim 4, further comprising:

setting a function of the shared partitioned view in the second terminal device, and reflecting the setting on the first terminal device.

7. A non-transitory computer readable storage medium storing a program which allows information to be shared by a plurality of terminal devices used by members performing Push to talk over Cellular (PoC) communications, the terminal devices including mobile phones used by members performing PoC, each of the mobile phones having a single screen operable and switchable with a use of multitask functions, the program causing a computer to execute: partitioning the single screen into a plurality of partitioned views including a first partitioned view for PoC communications and a second partitioned view used for communications other than PoC communications;

simultaneously displaying the first partitioned view and the second partition view on the screen of the terminal device;

displaying the first partitioned view of a first terminal device included in the plurality of terminal devices on the first partitioned view of a second terminal device included in the plurality of terminal devices at a same time, whereby the first and the second terminal devices share the first portioned view; and selecting an activated one of the plurality of partitioned views using a key input object screen switching button, thereby setting a view to which information is input by using keys of a key input device;

wherein:

when the view to which information is input is set to the first partitioned view, inputting information to the first view using the key input device of the terminal device; and when the view to which information is input is set to the second partitioned view, inputting information to the second view using the key input device of the terminal device.

8. The non-transitory computer readable storage medium as claimed in claim 7, wherein the program further causing the computer to execute switching a second partitioned view included in the plurality of partitioned views while displaying the first partitioned view.

9. A terminal device, the terminal device including a mobile phone, the mobile phone having a single screen operable and switchable with a use of multitask functions, the terminal device comprising:

hardware;

a screen activation unit implemented via the hardware for partitioning the single screen into a plurality of partitioned views including a first partitioned view used for Push to talk over Cellular (PoC) communications and a second partitioned view used for communications other than the PoC communications, and for displaying the plurality of partitioned views on the single screen; and wherein the screen activation unit reflects a function setting for a screen displayed on a mobile terminal held by a communication counterpart on the screen of a mobile terminal held by a user himself/herself, and keeps one of the plurality of partitioned views in an activated state, and activates the other of the plurality of partitioned views by interrupting the one of the plurality of partitioned views when PoC communications begin, the terminal device further comprising:

a key input object screen switching device for switching and selecting an activated one of the plurality of partitioned views; and a key input object screen switching button implemented via the hardware for operating the key input object screen switching device, wherein:

the key input object screen switching device is activated with the key input object screen switching button;

a view to which information is input by using keys of a key input device is set to the one of the plurality of partitioned views;

when the view to which information is input is set to the first partitioned view, information is input to the first view using the key input device of the terminal device; and when the view to which information is input is set to the second partitioned view, information is input to the second view using the key input device of the terminal device.

10. The terminal device according to claim 9, wherein the screen activation unit activates the plurality of partitioned screens views while keeping them displayed at a time of starting PoC communications.

11. The terminal device according to claim 9, wherein the screen activation unit activates a plurality of screens displayed on a mobile terminal held by a member performing the PoC communications on one screen.

* * * * *